United States Patent

Mahmoud et al.

[11] Patent Number: 5,286,417
[45] Date of Patent: Feb. 15, 1994

[54] METHOD AND COMPOSITION FOR MAKING MECHANICAL AND ELECTRICAL CONTACT

[75] Inventors: Issa S. Mahmoud, Apalachin, N.Y.; Julian P. Partridge, Austin, Tex.

[73] Assignee: International Business Machines Corporation, Armonk, N.Y.

[21] Appl. No.: 804,279

[22] Filed: Dec. 6, 1991

[51] Int. Cl.$^5$ .................... H01B 1/00; H01B 1/20; H01B 1/22

[52] U.S. Cl. .................. 252/518; 252/512; 252/514; 252/521; 528/350; 106/1.22; 420/507; 420/557

[58] Field of Search ............. 252/512, 514, 518, 521; 528/350, 353; 106/1.22, 1.23; 420/507, 557

[56] References Cited

U.S. PATENT DOCUMENTS

| | | | |
|---|---|---|---|
| 4,557,857 | 12/1985 | Sorensen | 252/503 |
| 4,568,592 | 2/1986 | Kawaguchi et al. | 252/514 |
| 4,612,361 | 9/1986 | Peters | 528/125 |
| 4,701,279 | 10/1987 | Kawaguchi et al. | 252/514 |
| 4,882,227 | 11/1989 | Iwase et al. | 252/512 |
| 4,886,874 | 12/1989 | Nagano et al. | 528/353 |
| 4,978,737 | 12/1990 | Vora | 528/353 |

*Primary Examiner*—Paul Lieberman
*Assistant Examiner*—M. Kopec
*Attorney, Agent, or Firm*—Duke W. Yee; Andrew J. Dillon

[57] ABSTRACT

A fusible conductive adhesive for making electrical and mechanical contact is provided. The fusible conductive adhesive contains a polymer having a glass transition temperature and a thermal expansion co-efficient. The thermal expansion co-efficient of the polymer is in the range of about 5 parts per million per degree centigrade to about 10 parts per million per degree centigrade along a z-axis. The polymer is loaded with a conductive material having a sintering temperature range overlapping the glass transition temperature of the polymer. In addition, the loading of the conductive material in the polymer is in the range of about 15% to about 20% conductive material by weight based on the total weight of the polymer and the conductive material.

13 Claims, 1 Drawing Sheet

METHOD AND COMPOSITION FOR MAKING MECHANICAL AND ELECTRICAL CONTACT

BACKGROUND OF THE INVENTION

1. Field of the Invention

The present invention relates in general to a conductive adhesive, and in particular to an anisotropic conductive adhesive. Still more particularly, the present invention provides a thermoplastic conductive adhesive that becomes uniaxially conductive upon the application of heat and a force.

2. Description of the Prior Art

In attaching electronic components to various surfaces, such as those on printed circuit boards or on other electronic components, it is desirable to use a composition or substance that is able to form a mechanical connection between the electronic component and the printed circuit board to hold the component in place. Moreover, the substance should be conductive in order to make an electrical contact between the component and the printed circuit board.

Presently, solder and conductive adhesives are some of the compositions utilized to form a mechanical and electrical connection between an electronic component and a printed circuit board. Solder has been used for many years to attach electronic components to printed circuit boards, but solder has a drawback since it contains toxic materials, i.e., lead. Moreover, as the leads extending from electronic components and the holes and contacts in which the leads are placed into or onto circuit boards become finer and finer and closer together, it becomes necessary to place precise amounts of the solder very accurately to avoid bridging or short circuiting between leads of an electronic component or leads between two or more electronic components.

The problem of bridging also occurred with conductive adhesives until anisotropic adhesives having the property of being uniaxially conductive were developed. The term "anisotropic" means exhibiting properties with different values when measured along axes in different directions. The term "uniaxially conductive" means e.g., conductive in a direction along a perpendicular axis intersecting two parallel planes generally normal to the perpendicular axis.

Conductive adhesive technology currently utilizes point contact between dispersed metallic particles to form a conductive path. In such a contact system, the mechanical integrity of the connection arises solely from the adhesive properties and the intrinsic strength of the polymeric matrix.

Increasing environmental concerns have led to a search for non-toxic alternatives. Many of these alternatives, such as gold or silver, are expensive and still are not very reliable. Currently, the anisotropic conductive adhesives that are available contain either gold or silver spheres dispersed in a polymer matrix or polymer spheres coated with silver or nickel. The spheres are forced into contact under an applied load which allows electronic percolation in localized regions. Such a system can experience problems such as electrical failure due to polymer expansion causing the spheres to lose contact with each other. In addition, these systems may also have problems with metal oxidation, causing high resistance paths at the interface.

Therefore, it would be desirable to have a method and apparatus for forming electrical and mechanical connections between electronic components that is non-toxic and low-cost.

SUMMARY OF THE INVENTION

It is an object of the present invention to provide an anisotropic conductive adhesive.

It is another object of the present invention to provide a thermoplastic conductive adhesive that becomes uniaxially conductive upon the application of heat and a force.

It is yet another object of the present invention to provide a environmentally desirable composition for forming mechanical and electrical contacts between two surfaces.

The foregoing objects are achieved as is now described. In accordance with the composition of the present invention, a fusible conductive adhesive for making electrical and mechanical contact is provided. The fusible conductive adhesive contains a polymer having a glass transition temperature and a thermal expansion co-efficient. The thermal expansion co-efficient of the polymer is in the range of about 5 parts per million per degree centigrade to about 10 parts per million along the z-axis. The term "z-axis" means a perpendicular axis intersecting the two parallel surfaces generally normal to the perpendicular axis in which electrical contact is desired. The polymer is loaded with a conductive material having a sintering temperature range overlapping the glass transition temperature of the polymer. In addition, the loading of the conductive material in the polymer is in the range of about 15% to about 20% conductive material by weight based on the total weight of the polymer and the conductive material.

The present invention also provides a method for making mechanical and electrical contact between two surfaces. First, a fusible conductive adhesive composition of the present invention is placed on at least one of the surfaces in which contact is desired. The adhesive composition contains particles of conductive material having a sintering temperature range and a polymer having a thermal expansion co-efficient in the range of about 5 parts per million to about 10 parts per million per degree centigrade along the z-axis and a glass transition temperature within the sintering range. The adhesive contains a loading of particles in a range of about 15% to about 20% by weight wherein the adhesive is anisotropic.

Next, the surfaces in which contact is desired are positioned over each other and a force is applied along a z-axis intersecting the two surfaces such that the fusible conductive adhesive is compressed between the two surfaces causing contact between the particles and the two surfaces. Afterwards, the fusible conductive adhesive is heated until the fusible conductive adhesive sets and becomes uniaxially conductive along the z-axis, thus forming an electrical connection between the two surfaces. The force is removed after the fusible conductive adhesive composition sets and becomes uniaxially conductive.

The above as well as additional objects, features, and advantages of the invention will become apparent in the following detailed description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
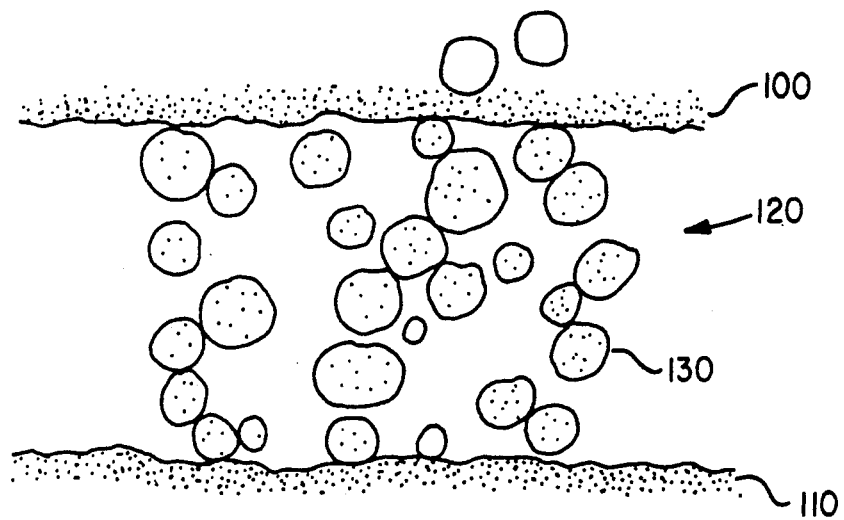
FIG. 1 depicts a schematic structure of a prior art conductive adhesive with 60 percent by volume metal filler.

With reference now to the figures and in particular with reference to FIG. 1,

As can be seen with reference to FIG. 1, there is depicted a schematic structure of a prior art conductive adhesive with 60 percent by volume metal filler. Under the prior art method for forming a connection between an electronic component surface 100 and a printed circuit board surface 110, a conductive adhesive comprising a polymer 120, containing tiny spheres or particles of conductive materials 130 such as gold, silver, or lead-tin solder, is utilized to form a mechanical and electrical connection between electronic component surface 100 and printed circuit board surface 110. The electrical connection is formed by the contact or close proximity of the particles of conductive materials 130 in the prior art conductive adhesive. One drawback with this type of conductive adhesive is that polymer expansion of polymer 120 can lead to increased resistance in the connection and eventually, electrical failure of the connection.

Figure 2:
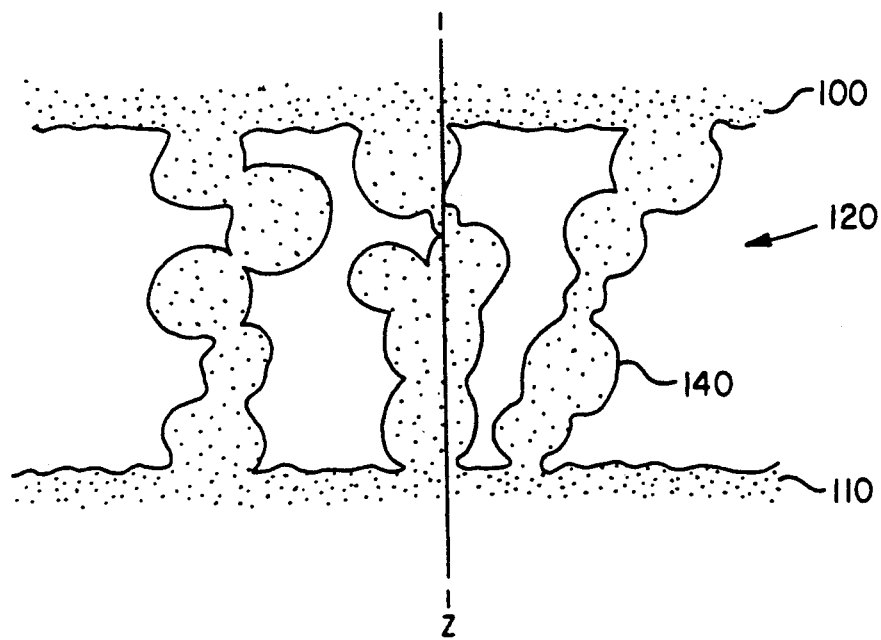
FIG. 2 is a schematic structure of the conductive adhesive of the present invention.

FIG. 2 is a schematic structure of the conductive adhesive of the present invention. Electronic component surface 100 and printed circuit board surface 110 are connected mechanically and electrically with an anisotropic polymer 120 and a continuous segment of conductive material 140.

Under the present invention, an anisotropic conductive adhesive is provided which permits electrical conduction through a fused or metallurgically bonded interface between surfaces, electronic component surface 100 and a printed circuit board surface 110, in which electrical connection is desired, opposed to the presently used point contact system.

In accordance with a preferred embodiment of the present invention, the adhesive contains two major components, an organic (polymer and solvent) component and a metallic conductive component. These two components form a conductive polymer matrix with the conductive component sintering to form continuous segment conductive material 140. First, the polymer component of the adhesive should be thermoplastic if reworking of electronic components attached to the printed circuit boards is desired.

Moreover, the polymer matrix component utilized must be anisotropic to produce a conductive adhesive that is uniaxially conductive (conductive in a direction along an axis intersecting the two surfaces in which electrical contact is desired, the z-axis). This system is contrasted by an isotropic adhesive system that has equal electrical conductivity properties in all directions. In addition, the polymer system should have a glass transition temperature that is within the range of the sintering temperature of the metal or alloy system component of the adhesive. In other words, the glass transition temperature must always be below the melting point of the conductive particles used in the adhesive under the present invention.

Next, the conductive component of the adhesive comprises particles of conductive materials. These conductive particles may be a metal or an alloy. Importantly, the conductive particles must have a sintering temperature range that overlaps or encompasses the glass transition temperature of the polymer component of the adhesive. Sintering between particles of a metal or alloy occurs when the metal or alloy particles are heated to temperatures sufficient to metallurgically bond them together. In effect, the particles have fused, but have not melted. Sintering the metal or alloy particles in the adhesive results in a continuous connection between the surfaces, such as an electronic component's leads and contacts on a printed circuit board, rather than just resulting in the particles touching or being in near proximity of each other.

This continuous connection formed through sintering the conductive particles to form an electrical connection between two surfaces has an advantage over the prior art conductive adhesives. Such a connection is not as susceptible to failure of the electrical connection due to polymer expansion causing conductive particles lose contact as in current conductive adhesives. Moreover, oxidation of the fused conductive particles is also less likely to cause increased resistivity problems in accordance with a preferred embodiment of the present invention.

Additionally, sintering of the conductive particles, i.e., metal or alloy, has the added benefit of enhancing the mechanical strength of the connection by adding to the mechanical integrity provided by the polymer component. This connection is an added benefit over the contact system currently utilized in conductive adhesives.

In sintering, it is important to avoid melting the metal or alloy system because rather than forming a continuous connection, the metal or alloy particles may cluster or clump in a portion of the polymer component, resulting in no electrical connection or a poor electrical connection being formed.

In accordance with a preferred embodiment of the present invention, the adhesive contains a polymer component that is thermoplastic. Such a polymer component is necessary in order to rework items or components attached with an adhesive. The polymer component of the adhesive should have a thermal expansion coefficient in the range of about 5 parts per million to about 10 parts per million per degree centigrade along the z-axis.

Next, the sintering temperature of the conductive particles and the glass transition temperature of the polymer system may be almost any temperature with the requirement that the glass transition temperature be within sintering temperature range. Restraints as to the sintering temperature range and glass transition temperature are also set by the electronic components being joined together or attached to surfaces. The temperatures cannot be above the temperature at which the electronic component would be destroyed, damaged, or rendered useless.

Consequently, the temperatures that an electrical component can stand form the upper limit of the sintering temperature ranges and glass transition temperatures of the adhesive under the present invention. In other words, the sintering temperature range of the conductive component may be high as long as some portion of the range is low enough to allow sintering of the conductive particles without destroying the electronic components being attached. The glass transition temperature of the polymer component must also be low enough to not cause damage to an electronic component.

When using a thermoplastic polymer, the lower limit of the temperature range for the glass transition temperature must be above the temperature at which the printed circuit boards and electronic components are tested after assembly or the temperature during actual use. Too low of a glass transition temperature may result in the adhesive flowing, resulting in a possible loss of mechanical and electrical connection. The sintering temperature could also be low as long as the melting point of the conductive particles is above these temperatures.

Next, another parameter of the conductive adhesive in accordance with a preferred embodiment of the present invention is the loading of the metal or alloy particles of the metal or alloy system. The loading affects the uniaxial conductive properties in the anisotropic adhesive. The loading range of the metal or alloy particles should be in the range of about 10 percent to 30 percent of conductive particles by weight based on the total weight of the polymer and the conductive material. All further references to the term "loading" of the conductive materials in the present invention means loading of the conductive particles in the polymer by weight based on the total weight of the polymer and the conductive material. The optimal loading range is from about 15 percent to 20 percent. These ranges of loading may vary from about two to three percent depending on the size and shape of the particles of conductive material utilized in the conductive adhesive.

In contrast to the loading under the present invention, loading in current conductive adhesives range from 60 percent to 80 percent of metal particles. The lower loading in the present invention is a factor in making the conductive adhesive of the present invention uniaxially conductive. If the loading is too high, the adhesive will not become uniaxially conductive and in fact, may become conductive in all directions, resulting in the problem of bridging. On the other hand, if the loading of the conductive particles in the polymer is too low, little or no electrical connection will be made, even after sintering the conductive particles.

In accordance with a preferred embodiment of the invention, the polymer system component of the adhesive would be a thermoplastic polymer, to allow reworking, with a glass transition temperature in the range of about 150° C. to 250° C. The conductive component of the adhesive would have sintering temperature range somewhere within the range of about 100° C. to about 250° C. In addition, the loading should be from about 15 percent to 20 percent of metal or alloy particles by weight. This range of temperatures is well within the temperature range that many electronic components can stand without being damaged or rendered useless.

Further, the adhesive, in accordance with a preferred embodiment of the present invention, includes a metal alloy as the conductive component of the adhesive. This metal alloy preferably has a melting point below 225° C. which allows sintering of the particles during the polymer reflow or curing of the conductive adhesive. One suitable alloy, among others, would be a tin-gold eutectic that is 10 percent gold. This alloy could be mixed with a thermoplastic copolymer such as the polymer having the segments PMDA-ODA-6FDA to form the conductive adhesive system in accordance with a preferred embodiment of the present invention. PMDA is pyromellitic dianhydride:

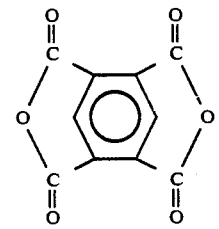

ODA is oxydianaline:

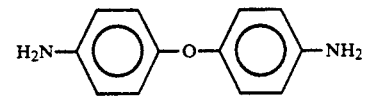

6FDA is hexafluorodianhydride:

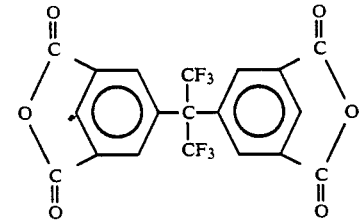

This thermoplastic copolymer may be synthesized by reacting one mole of ODA with one mole PMDA in an acetamid solvent at room temperature for at least one hour. Next, the solution is heated to 90° C. and one mole of 6FDA is added to the solution. This solution is reacted for 3 to 5 hours. The final solution should contain between 30 to 35 percent solids.

The adhesive paste is produced by adding the metal alloy, 90 percent tin and 10 percent gold in this embodiment, to the solution prepared in polymer synthesis. The total amount of polymer to alloy ratio is between 80 to 85 percent polymer to 15 to 20 percent metal by weight. Next, the mixture of metal alloy and polymer should be stirred very slowly for 2 to 3 hours until a very homogeneous mixture is obtained. The metal filler in this particular embodiment should be in a spherical shape that is 15 to 20 micrometers in diameter. In such a conductive adhesive, the alloy begins to sinter around 100° C. to 217° C. with the polymer component reflowing between 200° C. and 300° C.

Utilizing the conductive adhesive system in accordance with a preferred embodiment of the present invention has an advantage of being low cost as compared to systems using gold or silver. Examples of other alloys that could be used in a preferred embodiment of the present invention include a bismuth gold alloy that is 18 percent gold and a tin silver alloy that is 4 percent silver. The mixtures of these particular examples could be varied ±2 percent. Other alloys beyond these examples will be apparent to those skilled in the art. In addition, the conductive adhesive of the present invention is non-toxic when compared to the present use of lead based solders, making it environmentally desirable.

Another advantage of the conductive adhesive under the present invention is that the electrical connection does not suffer from the same problems of polymer expansion as with presently available conductive adhesives. In addition, the fused connection also lends to enhancing the mechanical integrity of the connection.

The conductive adhesive in accordance with a preferred embodiment of the present invention may be used to form a connection between an electrical component and a printed circuit board by placing the adhesive on the areas on the board or/and component in which an electrical and mechanical connection is desired. Then, the electrical component is placed onto the board. Next, pressure is utilized to compress the adhesive between contact surfaces of the electronic component and the printed circuit board. This pressure is applied while the adhesive is set by heating the adhesive to the temperature for glass transition and sintering.

The pressure applied during heating is applied along a z-axis, intersecting the two surfaces being connected. This pressure also causes the conductive particles to make contact, while the heating causes the conductive particles to sinter and form a continuous electrical connection. As a result, the adhesive becomes uniaxially conductive along the z-axis.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A fusible conductive adhesive for making electrical and mechanical contact comprising:
   an polymer matrix having a glass transition temperature from about 150° C. to about 300° C. and a thermal expansion coefficient from about 5 ppm/C to about 10 ppm/C along a z-axis;
   a conductive material having a sintering temperature range of between about 100° C. to about 250° C., wherein at least a portion of the sintering temperature range of the conductive material overlaps the glass transition temperature of the polymer matrix, wherein the conductive metal is loaded in the polymer matrix in the range of about 15 percent to about 20 percent conductive material by weight based on the total weight of the polymer matrix and the conductive material, wherein the fusible conductive adhesive composition is anisotropically conductive.

2. The fusible conductive adhesive of claim 1, wherein the conductive material is a metal alloy.

3. The fusible conductive adhesive of claim 2, wherein the metal alloy is about 90 percent tin and about 10 percent gold.

4. The fusible conductive adhesive of claim 2, wherein the metal alloy is about 82 percent bismuth and about 18 percent gold.

5. A fusible conductive adhesive composition for making electrical and mechanical contact between two surfaces comprising:
   a conductive material having a sintering temperature range within a range of temperatures between about 100° C. to about 250° C.;
   a thermoplastic polymer having a thermal expansion coefficient in a range of about 5 parts per million per degree centigrade to about 10 parts per million per degree centigrade and a glass transition temperature between about 150° C. to about 250° C.; and
   a loading of the conductive material and the thermoplastic polymer in a range of about 15 percent to about 20 percent of conductive material by weight, wherein the fusible conductive adhesive composition is anisotropically conductive.

6. The fusible conductive adhesive of claim 5, wherein the polymer is a thermoplastic polymer synthesized by reacting a pyromellitic dianhydride, an oxydianaline, and a hexafluorodianhydride.

7. The fusible conductive adhesive of claim 5, wherein the conductive material is a metal alloy.

8. The fusible conductive adhesive of claim 7, wherein the metal alloy is about 90 percent tin and about 10 percent gold.

9. The fusible conductive adhesive of claim 7, wherein the metal alloy is about 82 percent bismuth and about 18 percent gold.

10. A fusible conductive adhesive for making electrical and mechanical contact comprising:
    an polymer matrix synthesized by reaching a pyromellitic dianhydride, an oxydianaline, and a hexafluorodianhydride, wherein the polymer matrix has a glass transition temperature from about 200° C. to about 300° C. and a thermal expansion coefficient in range of about 5 ppm/C to about 10 ppm/C along a z-axis;
    a metal alloy having a sintering temperature range, the sintering temperature range of the metal alloy overlapping the glass transition temperature of the polymer matrix, wherein the conductive metal is loaded in the polymer matrix in the range of about 15 percent to about 20 percent conductive material by weight based on the total weight of the polymer matrix and the conductive material, wherein the fusible conductive adhesive composition is anisotropically conductive.

11. The fusible conductive adhesive of claim 10, wherein the metal alloy is about 90 percent tin and about 10 percent gold.

12. The fusible conductive adhesive of claim 10, wherein the metal alloy is about 96 percent gold and about 4 percent silver.

13. The fusible conductive adhesive of claim 10, wherein the metal alloy is about 82 percent bismuth and about 18 percent gold.

* * * * *